US006927423B2

(12) United States Patent
Sawaki et al.

(10) Patent No.: US 6,927,423 B2
(45) Date of Patent: Aug. 9, 2005

(54) SEMICONDUCTOR ELEMENT STRUCTURE, ELECTRON EMITTER AND METHOD FOR FABRICATING A SEMICONDUCTOR ELEMENT STRUCTURE

(75) Inventors: Nobuhiko Sawaki, Nagoya (JP); Yoshio Honda, Nagoya (JP)

(73) Assignee: Nagoya University, Nagoya (JP)

( * ) Notice: Subject to any disclaimer, the term of this patent is extended or adjusted under 35 U.S.C. 154(b) by 47 days.

(21) Appl. No.: 10/443,970

(22) Filed: May 23, 2003

(65) Prior Publication Data

US 2004/0061125 A1 Apr. 1, 2004

(30) Foreign Application Priority Data

Sep. 26, 2002 (JP) ....................................... 2002-280182

(51) Int. Cl.[7] ................................................ H01L 29/22

(52) U.S. Cl. ........................... 257/95; 257/99; 257/103; 438/22; 438/25

(58) Field of Search ........................... 257/95, 99, 103; 438/22, 25, 29, 128

(56) References Cited

U.S. PATENT DOCUMENTS

| | | | | | |
|---|---|---|---|---|---|
| 2002/0096994 | A1 | * | 7/2002 | Iwafuchi et al. | 313/495 |
| 2003/0107047 | A1 | * | 6/2003 | Okuyama et al. | 257/95 |
| 2004/0048409 | A1 | * | 3/2004 | Biwa et al. | 438/46 |
| 2004/0227152 | A1 | * | 11/2004 | Biwa et al. | 257/103 |

FOREIGN PATENT DOCUMENTS

| | | |
|---|---|---|
| JP | 2001-338568 | 12/2001 |

* cited by examiner

*Primary Examiner*—David Nelms
*Assistant Examiner*—Long Tran
(74) *Attorney, Agent, or Firm*—Oliff & Berridge, PLC

(57) ABSTRACT

A mask layer with an opening is formed on a main surface of a silicon substrate, which is exposed in the opening. Then, a hexagonal pyramidal island-shaped portion is formed from a first semiconductor nitride in the opening to complete a semiconductor element structure.

16 Claims, 3 Drawing Sheets

SEMICONDUCTOR ELEMENT STRUCTURE, ELECTRON EMITTER AND METHOD FOR FABRICATING A SEMICONDUCTOR ELEMENT STRUCTURE

BACKGROUND OF THE INVENTION

1. Field of the Invention

This invention relates to a semiconductor element structure which is usable as an electron beam source such as an electron emitter or in fabrication processes of semiconductor devices. This invention also relates to an electron emitter including the semiconductor element structure.

2. Description of the Related Art

An electron beam is employed in a measuring instrument such as an X-ray generating apparatus and a semiconductor micro-processing apparatus such as an electron beam exposing apparatus. In addition, the electron beam is employed as a beam source for exciting a fluorescent material. Conventionally, the electron beam has been made from a high melting point metallic material such as W or Mo or a compound thereof. Electron emission from the high melting point material is based on the principle of thermo-ionic emission, so that it is required to heat and maintain the material at a higher temperature. In view of energy saving, however, it has been desired to improve the conventional use of the high melting point material.

With the development of information technology, on the other hand, demand for a flat panel display as a display device of character/image information is increased, so that liquid display devices and plasma display devices have been developed. In case of a cold cathode flat panel display, the function is obtained by means of electron beam excitation which is also employed for a CRT. Since the cold cathode flat panel display can reduce the electric power consumption, and, is thinned and downsized, the practical use is desired. As of now, however, since the cold cathode material and the fabricating technique can not be established, the cold cathode flat panel display is not available commercially.

It is required to make the cold cathode electron beam source from a low electron affinity material such as diamond. As for the diamond, the electron affinity is very low, but the productivity may be deteriorated due to the poor processing performance. In case of Si, the productivity can be enhanced due to the excellent processing performance to reduce the driving, but the lifetime is deteriorated due to the high electron affinity.

Recently, using a carbon nanotube, a sharp emitter tip is obtained, so that the driving voltage can be reduced substantially and the brightness can be enhanced. As of now, however, the fabricating process can not be established.

In the above-mentioned respect, it has been desired to develop a new material for establishing a long life-time and high brightness electron beam source.

SUMMARY OF THE INVENTION

It is an object of the present invention, in view of the above-mentioned problem, to provide a semiconductor element structure which is usable as an electron beam source such as an electron emitter and a method for fabricating the semiconductor element structure.

For achieving the above object, this invention relates to a semiconductor element structure comprising:

a silicon substrate, a mask layer, formed on a main surface of the silicon substrate, with an opening where the main surface of the silicon substrate is exposed, and an island-shaped portion which is formed of hexagonal pyramidal grown on a first semiconductor nitride in the opening.

This invention also relates to a method for fabricating a semiconductor element structure, comprising the steps of:

preparing a silicon substrate, forming, on a main surface of the silicon substrate, a mask layer with an opening where the main surface of the silicon substrate is exposed, and forming, in the opening, an island-shaped portion on a first semiconductor nitride in a hexagonal pyramidal shape.

The inventors had intensive studied to achieve the above-mentioned objects. As the result, they found out the following facts.

A semiconductor nitride single crystal with a composition of AlxGayN ($x+y=1$, $0 \leqq x \leqq 1$, $0 \leqq y \leqq 1$) can be grown on a sapphire substrate or a silicon substrate by means of a MOCVD method if the epitaxial growth condition is controlled. Generally, however, the crystal quality of the single crystal can not be improved because of the difference in thermal expansion coefficients between the semiconductor nitride and the substrate. In this case, much dislocations and cracks are created in the single crystal.

According to the present invention, however, a silicon substrate is prepared, and a mask with an opening where the main surface is exposed is formed on the silicon substrate, and a semiconductor nitride is formed in the opening of the mask by means of a CVD method. In this case, the semiconductor nitride is grown by itself in a hexagonal pyramidal shape, irrespective of the shape of the opening, and the crystal orientation of the semiconductor nitride is determined by the crystal orientation of the silicon substrate. In other words, the semiconductor nitride is hetero-epitaxially grown in the hexagonal pyramidal shape on the silicon substrate as a different material.

As mentioned above, the semiconductor element structure includes the silicon substrate which is preferably usable as a substrate of an electron source such as an electron emitter because of the conductivity thereof. In the fabrication of the semiconductor nitride by means of a conventional technique such as the CVD method, much defects may be created near the interface of the semiconductor nitride and the silicon substrate. In this case, the silicon substrate exhibits n-type conductivity, so that a current can flow through the semiconductor element structure via an electrode provided on the back surface of the silicon substrate.

Since the semiconductor nitride is formed in the hexagonal pyramidal island, it can function as a tip of an electron emitter. The life time of the emitter is determined by the shape and the structure change of the forefront of the tip. If a metallic substance such as a W substance is heated in an oxygen-including atmosphere, the surface property of the metallic substance may be changed and becomes unstable. In contrast, the semiconductor nitride can exhibit high physical and chemical stability, so that the surface property the semiconductor nitride is not changed even in the harsh condition. As the result, the tip of the electron emitter can be enhanced in physical property, so the life-time of the tip can be enhanced.

In making the tip of the electron emitter by silicon, according to a conventional technique, in order to drive the electron emitter at lower voltages, the forefront of the tip is required to be sharpened to increase the strength of electric field thereat because of the large electron affinity of silicon. For example, in order to reduce the driving voltage down to 50V, the curvature radius of the forefront of the tip is required to be set to about 4 nm.

In contrast, in the present case, since the island-shaped tip is made from the semiconductor nitride so that the electron affinity can be reduced sufficiently, the driving voltage can be reduced down to about 45V even at a curvature radius of 200 nm. As the result, the driving voltage load can be reduced to enhance the life-time of the tip.

In consequence, according to the present invention, the semiconductor element structure which is usable as an electron emitter can be provided and the fabricating method for the semiconductor element structure can be provided.

In the present invention, if the size (diameter) of the opening is set to 1 μm and the arrangement period of opening is set to 250 μm, 250 million electron emitters can be fabricated per 1 $cm^2$ on the silicon substrate.

In a preferred embodiment of the present invention, a buffer layer may be provided by a second semiconductor nitride between the mask layer and the island-shaped portion. In making the island-shaped portion by means of a CVD method, if the island-shaped portion is formed directly in the opening of the mask layer, the source gases may chemically react with the silicon substrate to damage the main surface of the silicon substrate. In this condition, if the island-shaped portion is made by means of the CVD method, the crystal quality may be deteriorated not to exhibit the physical performance for a practical use such as the electron emitter.

With the buffer layer, the damage of the main surface through the CVD process can be inhibited to improve the crystal quality of the island-shaped portion.

In another embodiment of the present invention, a dopant may be incorporated in the island-shaped portion. In the semiconductor element structure of the present invention, since the crystal quality of the island-shaped portion is improved, the electrical resistance of the portion may be increased. As a result, the semiconductor element structure can not be employed as an electron source of an electron emitter.

Therefore, if the dopant is incorporated in the island-shaped portion, the electrical resistance of the portion can be decreased. As the result, even though the crystal quality of the island-shaped portion is improved, the electrical resistance can be reduced sufficiently, so that the semiconductor element structure can be employed as the electron source of the electron emitter.

In a still another embodiment of the present invention, a coating layer is formed from a third semiconductor nitride so as to cover the island-shaped portion. As mentioned above, in order to reduce the driving voltage of the tip of the electron emitter it is required to decrease the electron affinity. In this point of view, the tip is made by the semiconductor nitride with a large amount of Al. In this case, however, the electrical resistance of the tip is increased so that the resultant semiconductor element structure can not be used as the electron source of the electron emitter.

If the tip of high electrical resistance is covered with the coating layer having low electrical resistance, the electrical resistance of the island-shaped portion can be reduced substantially. As the result, the driving voltage of the electron source can be reduced due to the low electron affinity of the island-shaped portion.

Herein, in the present invention, one or plural openings may be formed at the mask layer and thus, one or plural island-shaped portions may be formed in the openings.

Other features and advantages of the present invention will be described hereinafter.

BRIEF DESCRIPTION OF THE DRAWINGS

For better understanding of the present invention, reference is made to the attached drawings, wherein.

DESCRIPTION OF THE PREFERRED EMBODIMENTS

This invention will be described in detail hereinafter.

Figure 1:
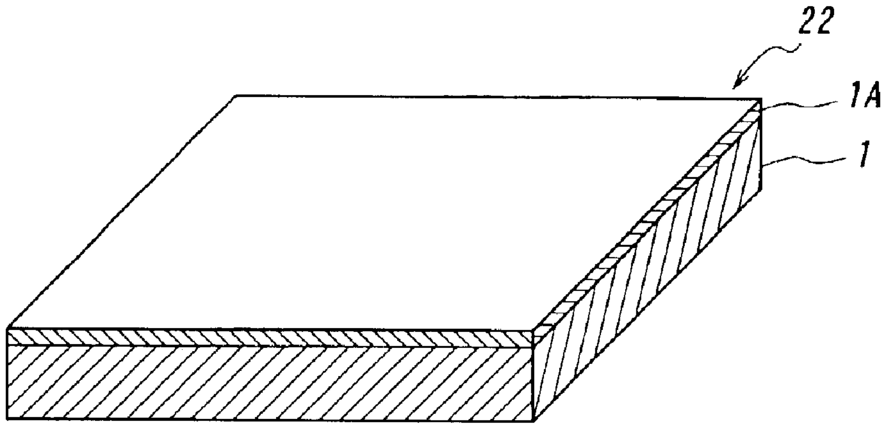
FIG. 1 is a perspective view showing one fabricating step for a semiconductor element structure according to the present invention.

FIGS. 1–5 show the fabricating process for a semiconductor element structure according to the present invention. First of all, a silicon substrate 1 is prepared. The silicon substrate 1 is made of a (111) plane-faced n-type silicon base. Then, as shown in FIG. 1, an underlayer 22 for a mask layer to be formed later is formed, e.g., in a thickness of 10–200 nm on the main surface 1A of the silicon substrate 1 by means of a conventional technique such as a sputtering method or a CVD method.

Figure 2:
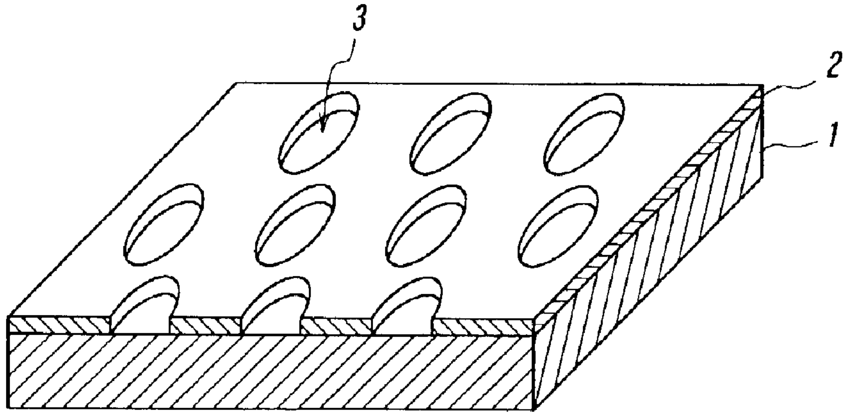
FIG. 2 is a perspective view showing the next step after the step shown in FIG. 1.

Then, photolithography technique or electron beam lithography technique is applied for the underlayer 22 to form a mask layer 2 with openings 3, as shown in FIG. 2.

No limitation is imparted to the shapes of the openings 3, so that any shapes may be imparted to the openings 3. For example, the openings 3 may be formed in circular shapes or rectangular shapes, respectively. In the former case, the diameter of the opening is preferably set within 20 nm–0.1 mm. In the latter case, the length of the side of the opening is preferably set within 20 nm–0.1 mm. If the sizes of the openings 3 are set within the above-mentioned range, the shapes of island-shaped portions to be formed later are not affected by the shapes of the openings 3. Therefore, if the shapes of the openings 3 are fluctuated largely, the shapes of the resultant island-shaped portions are set uniform.

Figure 3:
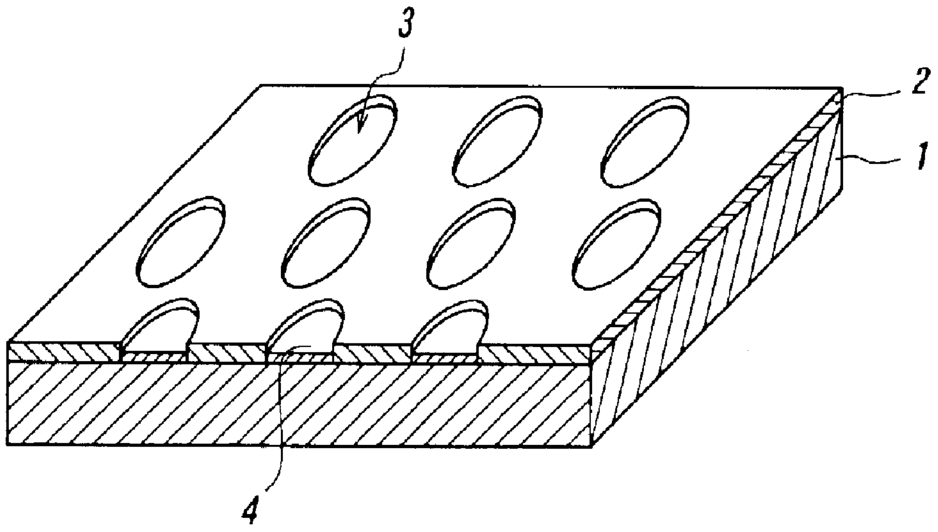
FIG. 3 is a perspective view showing the next step after the step shown in FIG. 2.

Then, as shown in FIG. 3, a buffer layer 4 is formed so as to cover the main surface 1A of the silicon substrate 1 which is exposed in the openings 3 of the mask layer 2. In this case, in making the island-shaped portions by means of a conventional technique, the damage of the main surface 1A of the silicon substrate 1 can be inhibited and thus, the crystal quality of the island-shaped portions can be improved. The thickness of the buffer layer 4 is preferably set within 50 nm–200 nm.

Although the film forming process is carried out over the mask layer 2 with the openings 3, the buffer layer 4 is formed on the main surface 1A of the silicon substrate 1 within the openings 3, not on the mask layer 2.

Since the buffer layer 4 functions as an underlayer for the fabrication of the island-shaped portions, it is made from a semiconductor nitride like the island-shaped portions. Concretely, the buffer layer 4 is made from the semiconductor nitride with a composition of Alx2Gay2N (x2+y2=1, $0 \leqq x \leqq 2 \leqq 1$, $0 \leqq y2 \leqq 1$).

It is desired that the Al composition x2 is set within 0.1–0.5, that is, the AlN content is set within 10–50 atomic percentages. In the Al-including semiconductor nitride, the electrical resistance is increased as the Al content is increased. Therefore, if the buffer layer 4 is made from the Al-including semiconductor nitride, the electrical resistance of the buffer layer 4 is increased as the Al content of the semiconductor nitride is increased. As the result, the resultant semiconductor element structure can not be employed as an electron source of an electron emitter.

In this case, if the Al content of the semiconductor nitride is set within the above preferable range, the electrical resistance and the buffer function of the buffer layer 4 are balanced to provide the semiconductor element structure which is usable as the electron source.

If the thickness of the buffer layer 4 is set to 50 nm or below, the electrical resistance of the buffer layer 4 can be reduced even though the Al content of the buffer layer 4 is increased more than the above-mentioned preferable range.

Figure 4:
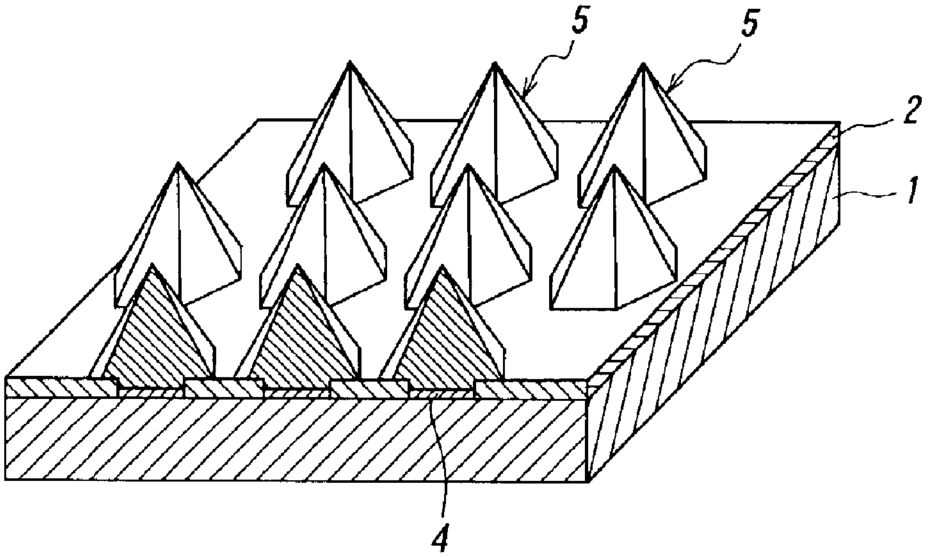
FIG. 4 is a perspective view showing the next step after the step shown in FIG. 3.

Then, as shown in FIG. 4, the island-shaped portions 5 are formed from a semiconductor nitride in the openings 3 of the mask layer 2. It is desired that the semiconductor nitride has a composition of Alx1Gay1N (x1+y1=1, 0≦x1≦1, 0≦y1≦1). The island-shaped portions 5 are formed in a hexagonal pyramidal shape on the silicon substrate 1 through heteroepitaxial growth. The island-shaped portions 5 have their respective side surfaces composed of (1–101) facet of the semiconductor nitride, originated from the (111) crystal orientation of the silicon substrate 1.

In this case, the electron affinity of the island-shaped portions 5 can be varied easily by changing the composition of the semiconductor nitride. Concretely, the electron affinity of the island-shaped portions 5 is decreased and the electrical resistance of the island-shaped portions 5 is increased as the Al content of the semiconductor nitride is increased. In order to decrease the electron affinity, the Al content of the semiconductor nitride is to be increased. In order to decrease of the electrical resistance, the Al content of the semiconductor nitride is to be decreased.

A dopant may be incorporated in the island-shaped portions 5 in order to reduce the electrical resistance thereof. As the dopant is exemplified Si.

The island-shaped portions 5 can be made by means of a CVD method, where the silicon substrate 1 is heated within 800–1200° C. and group III source gases and a nitrogen source gas are supplied onto the main surface 1A of the silicon substrate 1. As the group III source gases are exemplified trimethylaluminum (TMA) and trimethylgallium (TMG). As the nitrogen source gas is exemplified ammonia gas.

Without the buffer layer 4, in the fabrication of the island-shaped portions 5 by means of the CVD method, the ammonia gas is contacted with the main surface 1A of the silicon substrate 1 to be nitrided. In this case, the crystal quality of the island-shaped portions 5 is deteriorated.

In this point of view, it is desired that the group III source gas is supplied onto the main surface 1A of the silicon substrate 1, prior to the ammonia gas. In this case, the main surface 1A of the silicon substrate 1 is not almost nitrided, and thus, the crystal quality of the island-shaped portions 5 can be improved.

Figure 5:
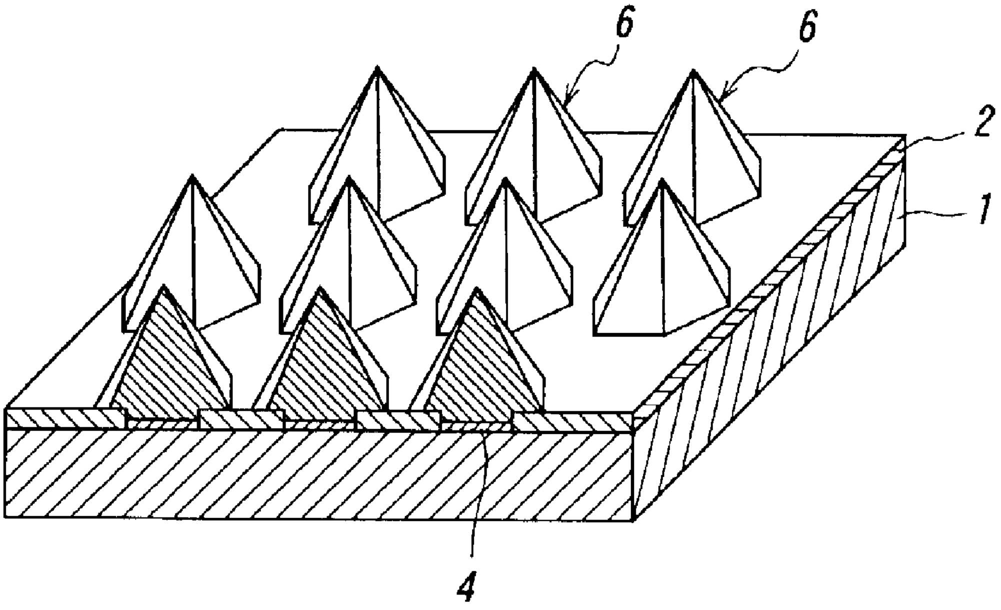
FIG. 5 is a perspective view showing the next step after the step shown in FIG. 4.

Then, as shown in FIG. 5, a coating layer 6 is formed by means of a conventional film-forming technique so as to cover the island-shaped portions 5 to complete an intended semiconductor element structure. The coating layer 6 is preferably made from a semiconductor nitride with a composition of Alx3Gay3N (x3+y3=1, 0≦x3≦1, 0≦y3≦1). The coating layer 6 is not essential in the present invention.

As mentioned above, as the Al content of a semiconductor nitride is increased, the electron affinity is decreased and the electrical resistance is increased. Therefore, if the island-shaped portions 5 are made from GaN and the coating layer 6 is made from AlN, the electron affinity and the electron emission efficiency of the resultant semiconductor element structure can be lowered and improved, respectively. As the result, the semiconductor element structure can be employed as an electron source of an electron emitter.

The thickness of the coating layer 6 is preferably set within 10–200 nm. If the thickness of the coating layer 6 is set more than 200 nm, cracks may be created in the coating layer 6 due to the difference in lattice constant between the island-shaped portions 5 and the coating layer 6. Moreover, the electrical resistance of the coating layer 6 may be increased not to exhibit the reduction effect of electron affinity.

In the resultant semiconductor element structure, even though the curvature radius of the forefronts of the island-shaped portions 5 set to 200 nm or over, the driving voltage can be reduced down to 45V in use as an electron beam source of an electron emitter.

Although the present invention was described in detail with reference to the above examples, this invention is not limited to the above disclosure and every kind of variation and modification may be made without departing from the scope of the present invention.

What is claimed is:

1. A semiconductor element structure comprising:

a silicon substrate, a mask layer, formed on a main surface of said silicon substrate, with an opening where said main surface of said silicon substrate is exposed, an island-shaped portion which is formed in a hexagonal pyramid on a first semiconductor nitride in said opening, and a buffer layer, formed only in said opening between said main surface of said silicon substrate and said island-shaped portion, made of a second semiconductor nitride with a composition Alx2Gay2N containing AlN of 10–50 atomic percentages (0.1≦x2≦0.5).

2. The semiconductor element structure as defined in claim 1, wherein said opening is made in a circular shape, and the diameter of said opening is set within 20 nm–0.1 mm.

3. The semiconductor element structure as defined in claim 1, wherein said opening is made in a rectangular shape, and the length of a side of said opening is set within 20 nm–0.1 mm.

4. The semiconductor element structure as defined in claim 1, said first semiconductor nitride has a composition of Alx1Gay1N (x1+y1=1, 0≦x1≦1, 0≦y1≦1).

5. The semiconductor element structure as defined in claim 4, wherein said first semiconductor nitride is GaN.

6. The semiconductor element structure as defined in claim 1, wherein the thickness of said buffer layer is set within 50–200 nm.

7. The semiconductor element structure as defined in claim 1, wherein the thickness of said buffer layer is set to 50 nm or below.

8. The semiconductor element structure as defined in claim 1, wherein a dopant is incorporated in said first semiconductor nitride constituting said island-shaped portion.

9. The semiconductor element structure as defined in claim 8, wherein said dopant is Si.

10. The semiconductor element structure as defined in claim 1, further comprising a coating layer made from a third semiconductor nitride so as to cover said island-shaped portion.

11. The semiconductor element structure as defined in claim 10, wherein said second semiconductor nitride has a composition of Alx3Gay3N (x3+y3=1, 0≦x3≦1, 0≦y3≦1).

12. The semiconductor element structure as defined in claim 11, wherein said third semiconductor nitride is AlN.

13. The semiconductor element structure as defined in claim 10, wherein the thickness of said coating layer is set within 10–200 nm.

14. The semiconductor element structure as defined in claim 1, wherein the curvature radius of a forefront of said island-shaped portion is set to 200 nm or over.

15. An electron emitter comprising a semiconductor element structure as defined in claim 1.

16. The electron emitter as defined in claim 15, comprising a threshold voltage of 45V or below.

* * * * *